(12) United States Patent
Lai et al.

(10) Patent No.: US 12,557,645 B2
(45) Date of Patent: Feb. 17, 2026

(54) SEMICONDUCTOR PACKAGES WITH THERMAL LID AND METHODS OF FORMING THE SAME

(71) Applicant: Taiwan Semiconductor Manufacturing Co., Ltd., Hsinchu (TW)

(72) Inventors: Po-Chen Lai, Hsinchu (TW); Ming-Chih Yew, Hsinchu (TW); Shu-Shen Yeh, Taoyuan (TW); Po-Yao Lin, Zhudong Township (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 603 days.

(21) Appl. No.: 17/698,611

(22) Filed: Mar. 18, 2022

(65) Prior Publication Data

US 2023/0024043 A1 Jan. 26, 2023

Related U.S. Application Data

(60) Provisional application No. 63/224,914, filed on Jul. 23, 2021.

(51) Int. Cl.
  *H01L 23/367* (2006.01)
  *H01L 21/48* (2006.01)
  (Continued)

(52) U.S. Cl.
  CPC ...... *H01L 23/3675* (2013.01); *H01L 21/4882* (2013.01); *H01L 25/0655* (2013.01); *H01L 23/49811* (2013.01); *H01L 23/49822* (2013.01); *H01L 23/49833* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2924/1611* (2013.01); *H01L 2924/1616* (2013.01); *H01L 2924/16235* (2013.01); *H01L 2924/16251* (2013.01); *H01L 2924/1632* (2013.01); *H01L 2924/182* (2013.01); *H01L 2924/3511* (2013.01); *H01L 2924/35121* (2013.01)

(58) Field of Classification Search
  None
  See application file for complete search history.

(56) References Cited

U.S. PATENT DOCUMENTS

| | | | |
|---|---|---|---|
| 7,527,090 B2 * | 5/2009 | Dani | H01L 23/367 165/185 |
| 11,062,971 B2 * | 7/2021 | Hung | H01L 21/4882 |

(Continued)

*Primary Examiner* — Long Pham
(74) *Attorney, Agent, or Firm* — Slater Matsil, LLP (57) ABSTRACT

Semiconductor three-dimensional integrated circuit packages and methods of forming the same are disclosed herein. A method includes bonding a semiconductor chip package to a substrate and depositing a thermal interface material on the semiconductor chip package. A thermal lid may be placed over and adhered to the semiconductor chip package by the thermal interface material. The thermal lid includes a wedge feature interfacing the thermal interface material. The thermal lid may be adhered to the semiconductor chip package by curing the thermal interface material.

20 Claims, 11 Drawing Sheets

(51) Int. Cl.
   *H01L 25/065*     (2023.01)
   *H01L 23/00*      (2006.01)
   *H01L 23/498*     (2006.01)

(56) References Cited

U.S. PATENT DOCUMENTS

| | | | |
|---|---|---|---|
| 2015/0187679 A1* | 7/2015 | Ho | H01L 23/055 |
| | | | 438/118 |
| 2022/0102288 A1* | 3/2022 | Hung | H01L 21/50 |
| 2023/0011493 A1* | 1/2023 | Hsieh | H01L 23/373 |

* cited by examiner

SEMICONDUCTOR PACKAGES WITH THERMAL LID AND METHODS OF FORMING THE SAME

PRIORITY CLAIM AND CROSS-REFERENCE

This application claims the benefit of U.S. Provisional Application No. 63/224,914, filed on Jul. 23, 2021, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is three-dimensional Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

A typical problem with three-dimensional integrated circuits is heat dissipation during operation. A prolonged exposure of a die by operating at excessive temperatures may decrease the reliability and operating lifetime of the die. This problem may become severe if the die is a computing die such as a central processing unit (CPU), which generates a lot of heat. As such, improvements to heat transfer are still needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, three-dimensional integrated circuits (3DICs) offer many solutions to reducing physical sizes of packaged components and allowing for a greater number of components to be placed in a given chip area. One solution that 3DIC components offer is to stack dies on top of one another and interconnect or route them through connections such as through-silicon vias (TSVs). Some of the benefits of 3DIC, for example, include exhibiting a smaller footprint, reducing power consumption by reducing the lengths of signal interconnects, and improving yield and fabrication cost if individual dies are tested separately prior to assembly. One challenge with 3DIC components is dealing with heat dissipation and managing thermal hotspots during operation.

Embodiments described herein relate to a semiconductor device including a thermal lid for high power applications such as chip-on-wafer-on-substrate (CoWoS) applications using high performance processors (e.g., graphics processing unit (GPU)) and methods of manufacturing the same. In embodiments, an angled projection extends from a bottom surface of the thermal lid, the angled projection interfacing a thermal interface material disposed over a semiconductor device mounted to a substrate. Features of the thermal lid and thermal interface material provide a robust CoWoS thermal transfer performance of a package with multiple chips.

Figure 1:
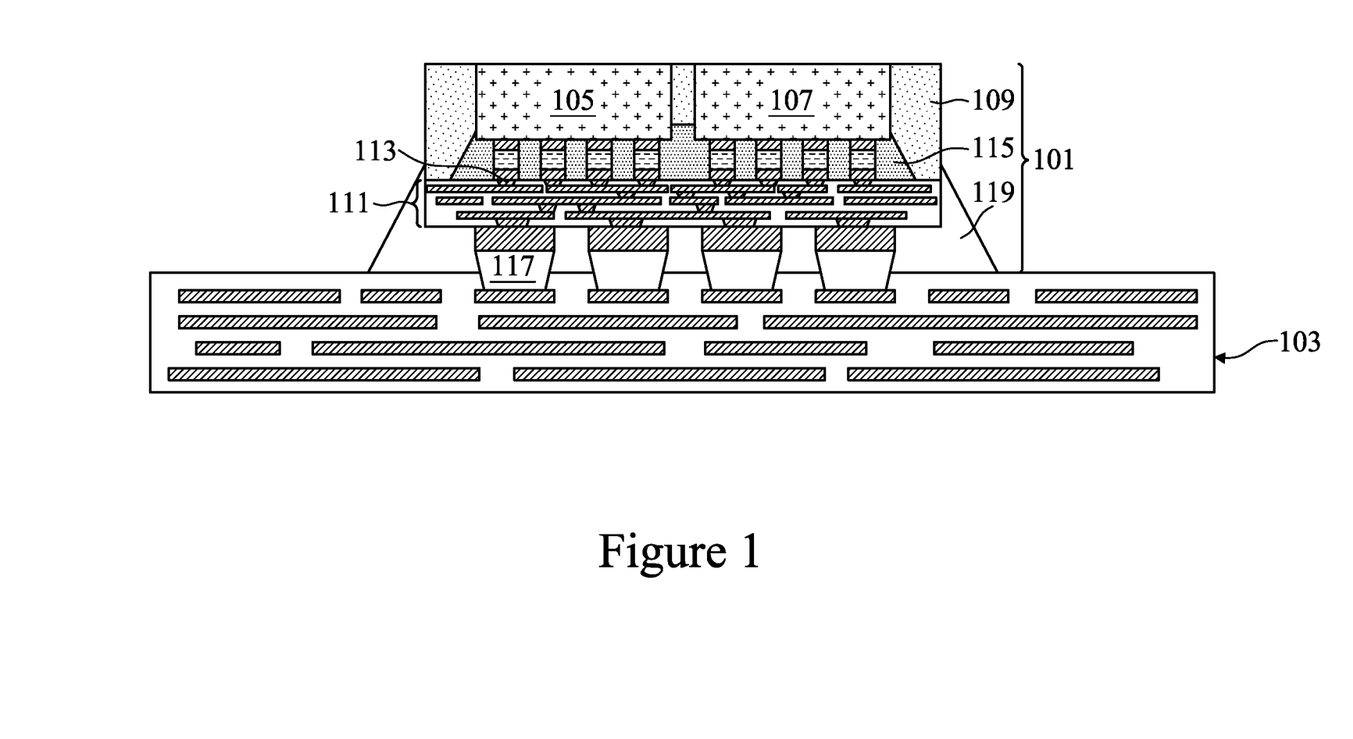
FIG. 1 illustrates an intermediate step forming an integrated fan-out package, in accordance with some embodiments.
Figure 2:
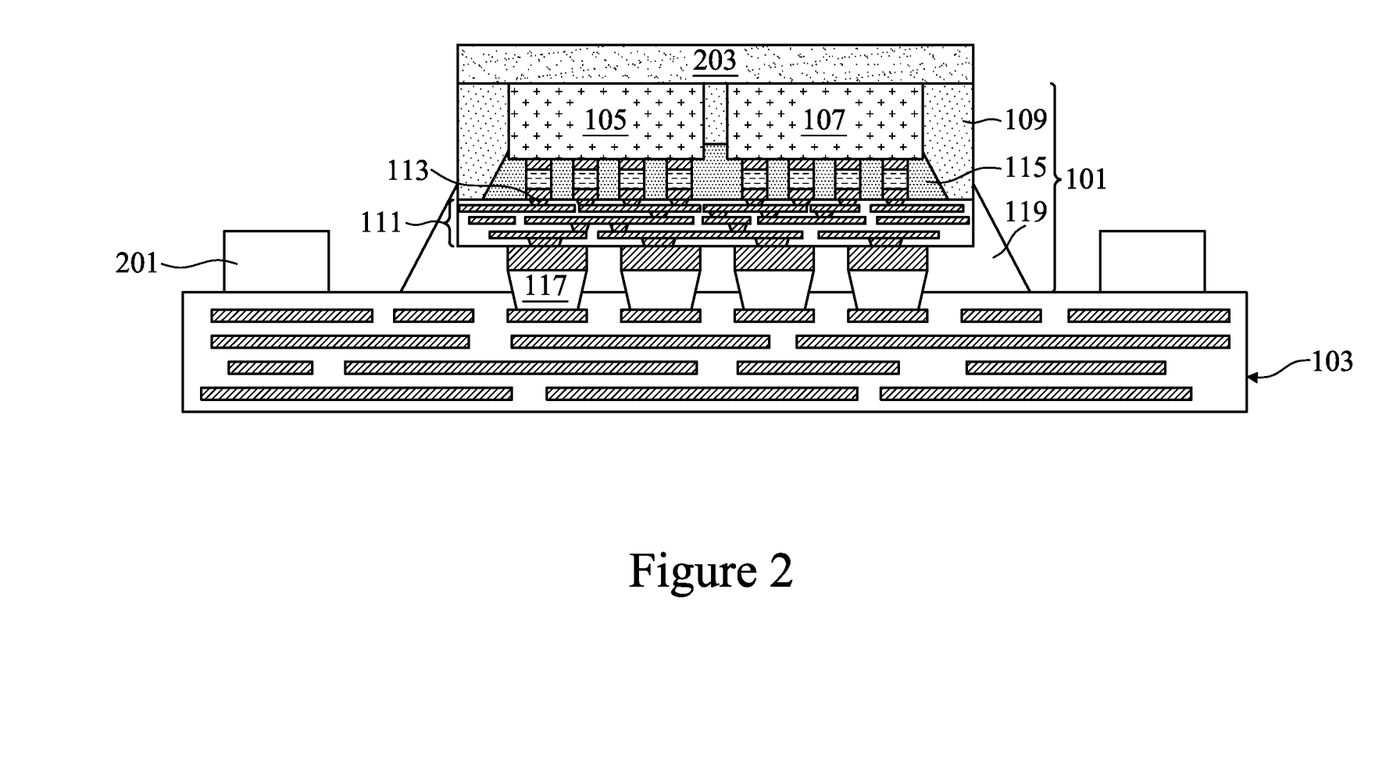
FIGS. 2 and 3 illustrate intermediate steps in attaching a thermal lid to the integrated fan-out package, in accordance with some embodiments.
Figure 3:
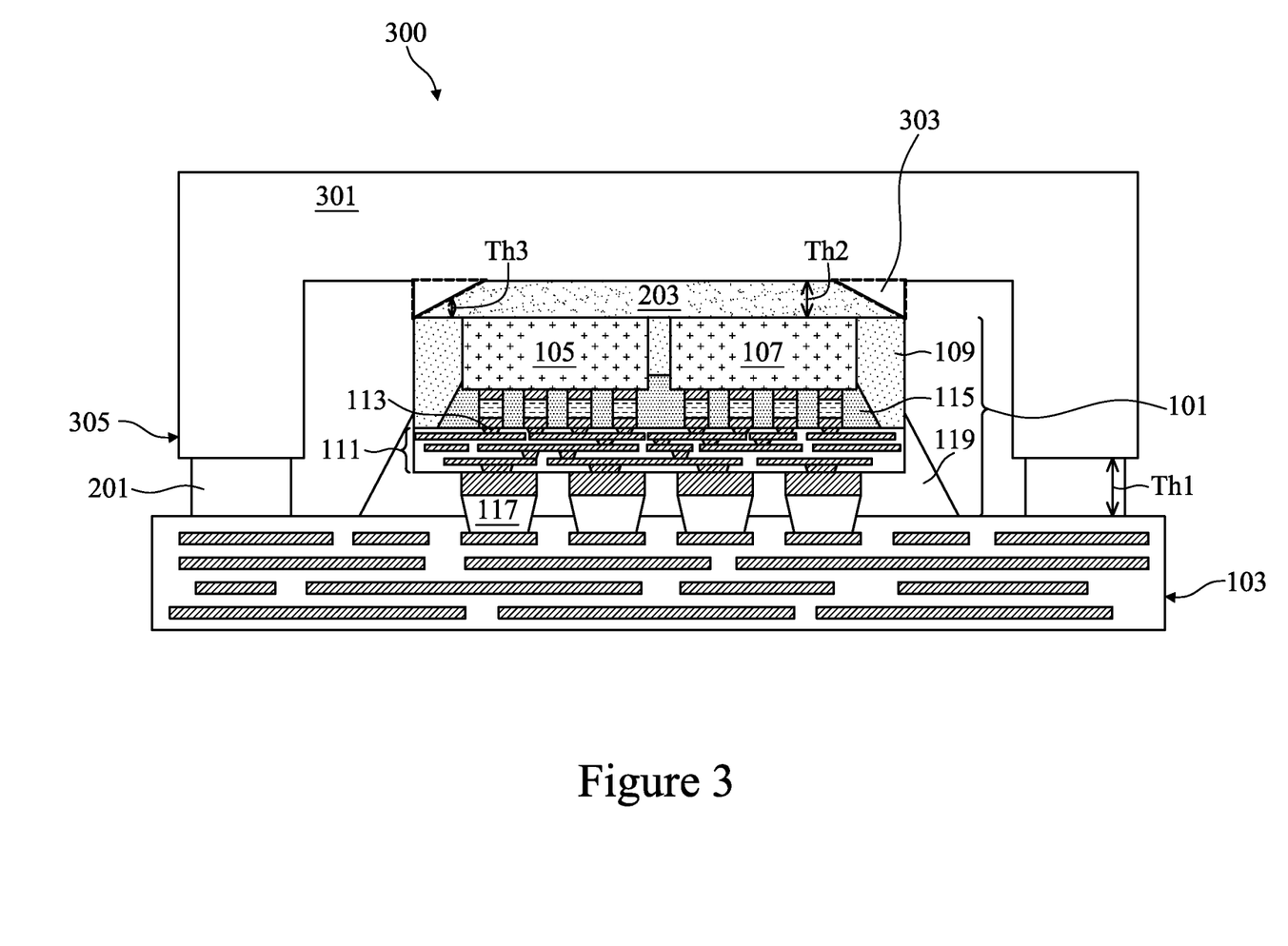

FIGS. 1 through 3 illustrate cross-sectional views of intermediate stages of manufacturing a three-dimensional integrated circuit (3DIC) package 300, such as a Chip-on-Wafer-on-Substrate (CoWoS) package, in accordance with various embodiments. In various embodiments, the first 3DIC package 300 may include interposers such as redistribution layer (RDL) interposers, molding-based interposers, or the like and chip stacking such as logic-on-logic (LoL), memory-on-logic (MoL), or the like.

With reference now to FIG. 1, this figure illustrates a package 101 (e.g., a chip-on-wafer (CoW) package) bonded to a substrate 103. The package 101 may be referred to herein as an interposer package, a semiconductor chip package, a stacked chip package, a stacked semiconductor device package, a stacked device package, or the like. According to some embodiments, the package 101 may include a high-power consuming die 105 disposed adjacent to a low-power consuming die 107. The high-power consuming die 105 and the low-power consuming die 107 may be die stacks and may be referred to as chips. The high-power consuming die 105 consumes a relatively high amount of power and, therefore, generates a relatively large amount of heat compared to the low-power consuming die 107. For example, the high-power consuming die 105 may consume from about 100 W to about 1,000 W of power and the low-power consuming die 107 may consume from about 10 W to about 100 W of power. A ratio of the power consumed by the high-power consuming die 105 to the power consumed by the low-power consuming die 107 may be from about 10 to about 30, such as about 16. The high-power consuming die 105 may be a processor, such as a system-on-chip (SoC), a central processing unit (CPU), a graphics processing unit (GPU), or the like. The low-power consuming die 107 may be a memory die such as a DRAM, high bandwidth memory (HBM), memory cube, a memory stack, or the like. While FIG. 1 illustrates a package 101 having one high-power consuming die 105 and one low-power consuming die 107, other embodiments may include any number of high-power consuming dies 105 and/or low-power consuming dies 107.

The high-power consuming die 105 and the low-power consuming die 107 may be surrounded by an encapsulant 109 which includes a molding compound. The high-power consuming die 105, the low-power consuming die 107, and the encapsulant 109 may be planarized such that top surfaces of the high-power consuming die 105, the low-power consuming die 107, and the encapsulant 109 are level. Because heat may not be generated in the encapsulant 109, heat dissipation requirements may be lower in areas near the encapsulant 109.

The high-power consuming die 105 and the low-power consuming die 107 are bonded to a top surface of a package component 111. The high-power consuming die 105 and the low-power consuming die 107 may be electrically and mechanically coupled to the package component 111 through first connectors 113, which may be conductive bumps, micro bumps, metal pillars, or the like. One or more underfill materials 115 may be formed between the high-power consuming die 105 and the low-power consuming die 107 and the package component 111, surrounding the first connectors 113.

The package component 111 may be an interposer substrate, which may be a semiconductor substrate such as a silicon substrate. The package component 111 may also be formed of another semiconductor material such as silicon germanium, silicon carbon, or the like. In accordance with some embodiments, active devices such as transistors (not separately illustrated) are formed at a surface of the package component 111. Passive devices (not separately illustrated) such as resistors and/or capacitors may also be formed in the package component 111. In accordance with alternative embodiments of the present disclosure, the package component 111 may be a semiconductor substrate or a dielectric substrate, and the respective package component 111 may not include active devices therein. In accordance with these embodiments, the package component 111 may, or may not, include passive devices formed therein.

The package component 111 may include an interconnect structure formed over a substrate which is used to electrically connect integrated circuit devices of the package 101. The interconnect structure may include a plurality of dielectric layers, metal lines formed in the dielectric layers, and vias formed between, and interconnecting, the overlying and underlying metal lines. In accordance with some embodiments, the dielectric layers may be formed of silicon oxide, silicon nitride, silicon carbide, silicon oxynitride, combinations thereof, and/or multi-layers thereof. Alternatively, the dielectric layers may include one or more low-k dielectric layers having low dielectric constants (k values). The k values of the low-k dielectric materials in the dielectric layers may be lower than about 3.0 or lower than about 2.5, for example. In some embodiments, the package component 111 may comprise through vias (not separately illustrated) which may be formed to extend from the top surface of the package component 111 into the package component 111. In embodiments in which the package component 111 is a silicon interposer or an organic interposer, the through vias may be referred to as through-substrate vias or through-silicon vias.

The package component 111 of the package 101 is bonded to a top surface of the substrate 103. The package component 111 may be electrically and mechanically coupled to the substrate 103 through second connectors 117, which may be conductive bumps, micro bumps, metal pillars, or the like. A second underfill material 119 may be formed between the package component 111 and the substrate 103, surrounding the second connectors 117.

The substrate 103 may be a package substrate, which may be a printed circuit board (PCB) or the like. The substrate 103 may include one or more dielectric layers and electrically conductive features, such as conductive lines and vias. In some embodiments, the substrate 103 may include through-vias, active devices, passive devices, and the like. The substrate 103 may further include conductive pads formed at the upper and lower surfaces of the substrate 103. The second connectors 117 may be coupled to conductive pads at the top surface of the substrate 103.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In FIG. 2, an adhesive 201 and a thermal interface material (TIM) 203 are deposited on the substrate 103 and over the encapsulant 109, the high-power consuming die 105, and the low-power consuming die 107, respectively. The adhesive 201 may be an epoxy, a silicon resin, a glue, or the like. The adhesive 201 may have a better adhering ability than the TIM 203. The adhesive 201 may have a thermal conductivity from about 1 W/m·K to about 3 W/m·K, lower than about 0.5 W/m·K, or the like. The adhesive 201 may be positioned so as to allow a heat dissipating feature (e.g., a first lid 301, illustrated in FIG. 3) to be attached around the package 101. Thus, in some embodiments, the adhesive 201 may be disposed around the perimeter of, or even encircle, the package 101.

The TIM 203 may be a polymer having a good thermal conductivity, which may be from about 3 W/m·K to about 5 W/m·K. In some embodiments, the TIM 203 may include a polymer with thermal conductive fillers. The thermal conductive fillers may increase the effective thermal conductivity of the TIM 203 to be from about 10 W/m·K to about 50 W/m·K or more. Applicable thermal conductive filler materials may include aluminum oxide, boron nitride, aluminum nitride, aluminum, copper, silver, indium, a combination thereof, or the like. In other embodiments, the TIM 203 may comprise other materials such as a metallic-based or solder-based material comprising silver, indium paste, or the like. In still further embodiments, the TIM 203 may comprise a film-based or sheet-based material, such as a sheet-based material including synthesized carbon nanotubes (CNTs) or a thermally conductive sheet having vertically oriented graphite fillers. Although the TIM 203 is illustrated as a continuous TIM extending over the high-power consuming die 105 and the low-power consuming die 107, in other embodiments, the TIM 203 may be physically disconnected. For example, air gaps may be disposed in the TIM 203 between adjacent dies (e.g., the high-power consuming die 105 and/or the low-power consuming die 107) to reduce lateral thermal interaction between the dies. In some embodiments, the TIM 203 may be deposited after the adhesive 201; however, the TIM 203 may also be deposited before the adhesive 201. In some embodiments, the TIM 203 may be provided in a form of fluid glue or a tape. In some embodiments, the adhesive 201 and/or the TIM 203 may be provided on surfaces of a lid (e.g., the first lid 301, not illustrated in FIG. 2 but illustrated and described further below with respect to FIG. 3), and then the lid, the adhesive 201 and the TIM 203 may be adhered to the substrate 103, the encapsulant 109, the high-power consuming die 105, and the low-power consuming die 107.

In FIG. 3, a first lid 301 is attached to the substrate 103 and the package 101 to form the first 3DIC package 300, in accordance with some embodiments. The first lid 301 may be referred to herein as a heat spreader, a thermal lid, a vapor condensing lid, or the like. The first lid 301 may be attached to protect the package 101 and the substrate 103 and to spread heat generated from the package 101 to a larger area, dissipating the heat from the package 101. The first lid 301 may be formed from a material having a high thermal conductivity, such as steel, stainless steel, copper, aluminum, combinations thereof, or the like. In some embodiments, the first lid 301 may be a metal coated with another metal, such as gold. The first lid 301 may be formed of a material having a thermal conductivity from about 100 W/m·K to about 400 W/m·K, such as about 400 W/m·K. The first lid 301 covers and surrounds the package 101. In some embodiments, the first lid 301 is a single continuous material. In other embodiments, the first lid 301 may include multiple pieces that may be the same or different materials.

In accordance with some embodiments, the first lid 301 further comprises a first wedge feature 303 which makes a bottom surface of the first lid 301 more compliant to a top surface of the package 101. During placement of the first lid 301, pressure may be applied to compress the TIM 203 such that the thermal interface material conforms to the bottom surfaces of the first lid 301 including the first wedge features 303. Due to package warpage, a distance between the top surface of the package 101 and the first lid 301 may vary from a center portion of the package 101 to a perimeter and/or corner portions of the package 101.

According to some embodiments, the TIM 203 may be displaced to have a second thickness Th2 over the center portion of the package 101 and to have a third thickness Th3 over a perimeter and/or corner portions of the package 101. In some embodiments, the thickness of the TIM 203 is a graded thickness from the second thickness Th2 at a tapered edge of the first wedge features 303 to a minimum thickness at an edge of the encapsulant 109.

The second thickness Th2 may be associated with a minimum bond line thickness (BLT) of the TIM 203 to accommodate heat transfer from the high-power consuming die 105 and/or the low-power consuming die 107 located at the center portion of the package 101. According to some embodiments, the second thickness Th2 may be a thickness in the range between about 0.05 mm and about 0.15 mm. However, any suitable thickness may be used.

The third thickness Th3 may be associated with a minimum bond line thickness (BLT) of the TIM 203 to accommodate heat transfer from the encapsulant 109 located at the perimeter of the package 101. The third thickness Th3 may be associated with a thickness and shape that conforms to an interface with the first wedge feature 303. According to some embodiments, the third thickness Th3 may be a thickness in the range between about 0.05 mm and about 0.15 mm. However, any suitable thickness may be used. The difference between the minimum BLT of the TIM 203 over the semiconductor die and the minimum BLT of the TIM 203 over the encapsulant 109 allows for better coverage of the TIM 203 between the two surfaces. As such, delamination of the TIM 203 from the surfaces of the encapsulant at package corner/edge is prevented and performance of heat dissipation may be improved.

The adhesive 201 has a greater adhering ability, but a lower thermal conductivity than the TIM 203. As a result, the adhesive 201 is disposed around the periphery of the package 101 between a foot region 305 of the first lid 301 and the substrate 103 to adhere the first lid 301 to the substrate 103. The TIM 203 is disposed on the high-power consuming die 105 and the low-power consuming die 107 between the high-power consuming die 105 and the low-power consuming die 107 and the first lid 301 to dissipate heat from the high-power consuming die 105 and the low-power consuming die 107 to the first lid 301.

In some embodiments, a curing process may be performed to cure the adhesive 201 and/or the TIM 203. Suitable curing processes may include but are not limited to a clamping curing process. Such clamping curing processes may utilize clamping plates and fasteners to control a clamping force applied between an upper clamping plate arranged over the first 3DIC package 300 and a lower clamping plate arranged under the first 3DIC package 300. In some embodiments, a clamping force from about 3 kgf to about 100 kgf during a clamping curing process may be used to cure the adhesive 201 and/or the TIM 203. In some embodiments, distribution plates may be disposed between the lower clamping plate and the substrate 103 and/or between the upper clamping plate and the first lid 301. Such distribution plates may be formed of an elastic material, a rubber material, or the like and may be used to evenly distribute the force applied by the clamping plates across the surfaces of the substrate 103 and/or the first lid 301.

Applying the clamping force during the clamping curing process may reduce the bond line thickness (BLT) of the adhesive 201 and the TIM 203, improves the uniformity of the thicknesses of the adhesive 201, and improves the coverage of the TIM 203 including the compliancy of the TIM 203 at the interfaces with the first wedge feature 303. After the first 3DIC package 300 has been clamped, the adhesive 201 may have a first thickness Th1 of between about 0.05 mm and about 0.2 mm and the TIM 203 may have a second thickness Th2 over the center portion of the package 101 from about 0.02 mm to about 0.1 mm, according to some embodiments. Furthermore, the TIM 203 may have a third thickness Th3 over a perimeter and/or corner portions of the package 101 less than about 0.1 mm, according to some embodiments. These improvements reduce the likelihood that the first lid 301 will delaminate from the package 101 and the substrate 103. As a result, semiconductor packages formed according to the above-described methods have reduced thicknesses, improved thermal performance, improved reliability, and reduced defects.

Once clamped, the first 3DIC package 300 may be placed in a curing oven to cure the adhesive 201 and/or the TIM 203. In some embodiments, the adhesive 201 and the TIM 203 may be cured at a temperature from about 100° C. to about 260° C., for a period from about 20 seconds to about 2 hours, while the clamping plates apply the clamping force. However, any suitable temperatures and/or time periods may be used.

Figure 4:
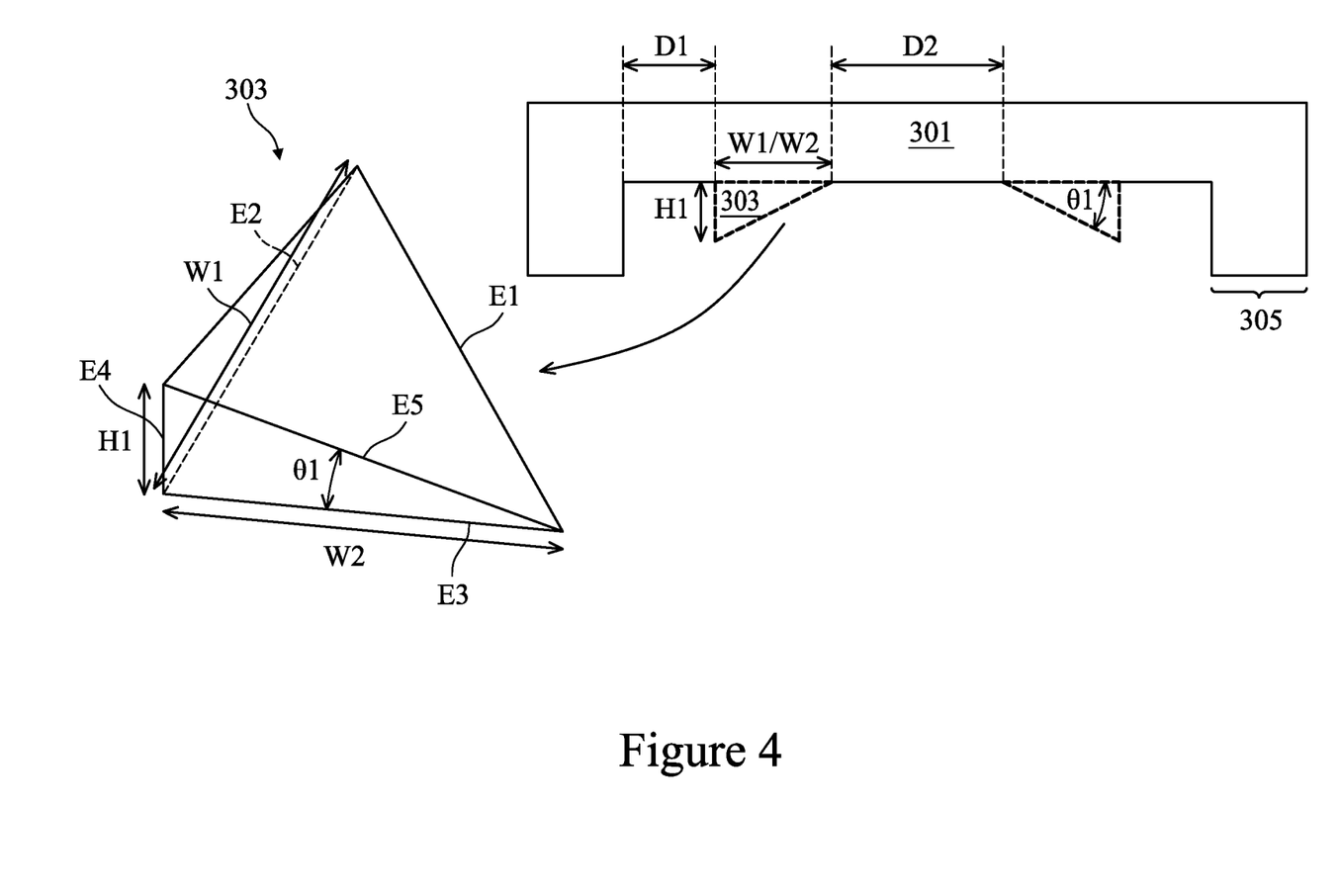
FIGS. 4 and 5 illustrate a cross-sectional view and a top down view of the thermal lid with first wedge features in a first location, respectively, in accordance with some embodiments.

Turning to FIG. 4, this figure illustrates a cross sectional view of the first lid 301 and a magnified perspective view of a first wedge feature 303, according to some embodiments. In particular, FIG. 4 illustrates the first wedge feature 303 having a tapered front edge E1, a first width W1 along a first base edge E2, a second width W2 along a second base edge E3, a first height H1 along a backend edge E4, and a first angle θ1 between the second base edge E3 and a first top edge E5. According to some embodiments, the first width W1 may be a width between about 0.1 mm and about 1.0 mm. In some embodiments, the second width W2 may be a width between about 0.1 mm and about 1.0 mm. However, any suitable widths may be used for the first width W1 and the second width W2. The first height H1 may be a height between about 0.02 mm and about 0.10 mm, in accordance with some embodiments. However, any suitable height may be used. In some embodiments, the first angle θ1 may be an angle between about 5° and about 45°. However, any suitable angle may be used.

FIG. 4 further illustrates the first wedge features 303 are located a first distance D1 from a sidewall of the first lid 301. According to some embodiments, the first distance D1 may be between about 2 mm and about 10 mm. However, any suitable distance may be used. Furthermore, FIG. 4 also illustrates a central portion of the first lid 301 that has a second distance D2 extending between inner edges of the first wedge features 303, according to some embodiments. In some embodiments, the second distance D2 may be between about 10 mm and about 60 mm. However, any suitable distance may be used.

Figure 5:
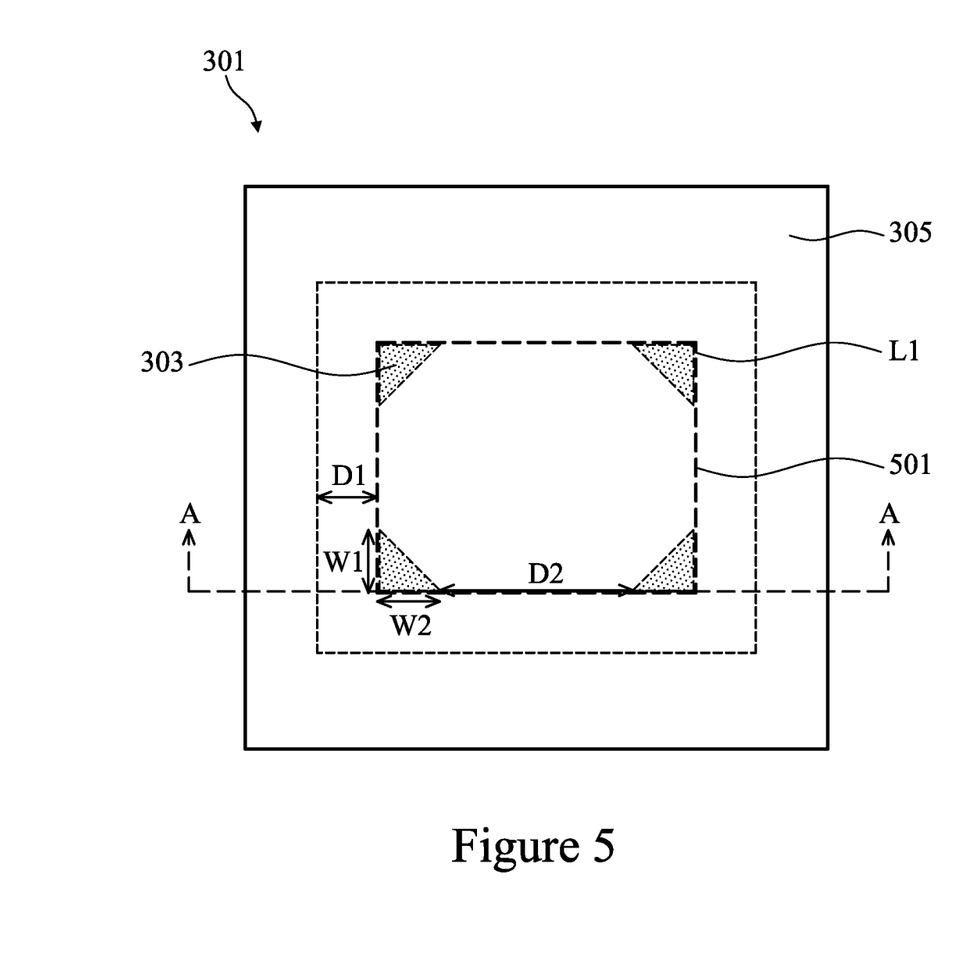

FIG. 5 illustrates a top-down view of the first lid 301 illustrated in FIG. 4, in accordance with some embodiments. In particular, FIG. 5 illustrates the first wedge features 303, the foot region 305, and an interposer region 501 in phantom view to indicate the locations of these features, according to some embodiments, beneath the upper surface of the first lid 301. In some embodiments, the interposer region 501 is surrounded by the foot region 305 of the first lid 301. According to some embodiments, the first wedge features 303 are located at first locations L1 of the first lid 301, the first locations being at the corners of the interposer region 501. In the first location L1, a sidewall of the first wedge features 303 substantially align with an edge of the package 101, as shown in FIG. 3. In some embodiments, the first wedge features 303 may be beveled surfaces of the first lid 301, the beveled surfaces having lateral extents that are aligned with a lateral extent of the encapsulant 109. However, the lateral extents of the beveled surfaces may not be aligned with the lateral extent of the encapsulant 109. FIG. 5 further illustrates the first width W1, the second width W2, the first distance D1, and the second distance D2 of the first wedge features 303. Still further, FIG. 5 illustrates a first cut line A-A through the first lid 301 which represents the cross section illustrated in FIG. 4.

By utilizing the first lid 301 as described, the physical contact between the TIM 203 and the first lid 301 may be increased and also helps to increase the compliance of the TIM 203 to the package 101 and the fourth lid 1001 during any warpage. As such, the first wedge features 303 help to prevent delamination of the TIM 203 from the first lid 301 due to package warpage.

Figure 6:
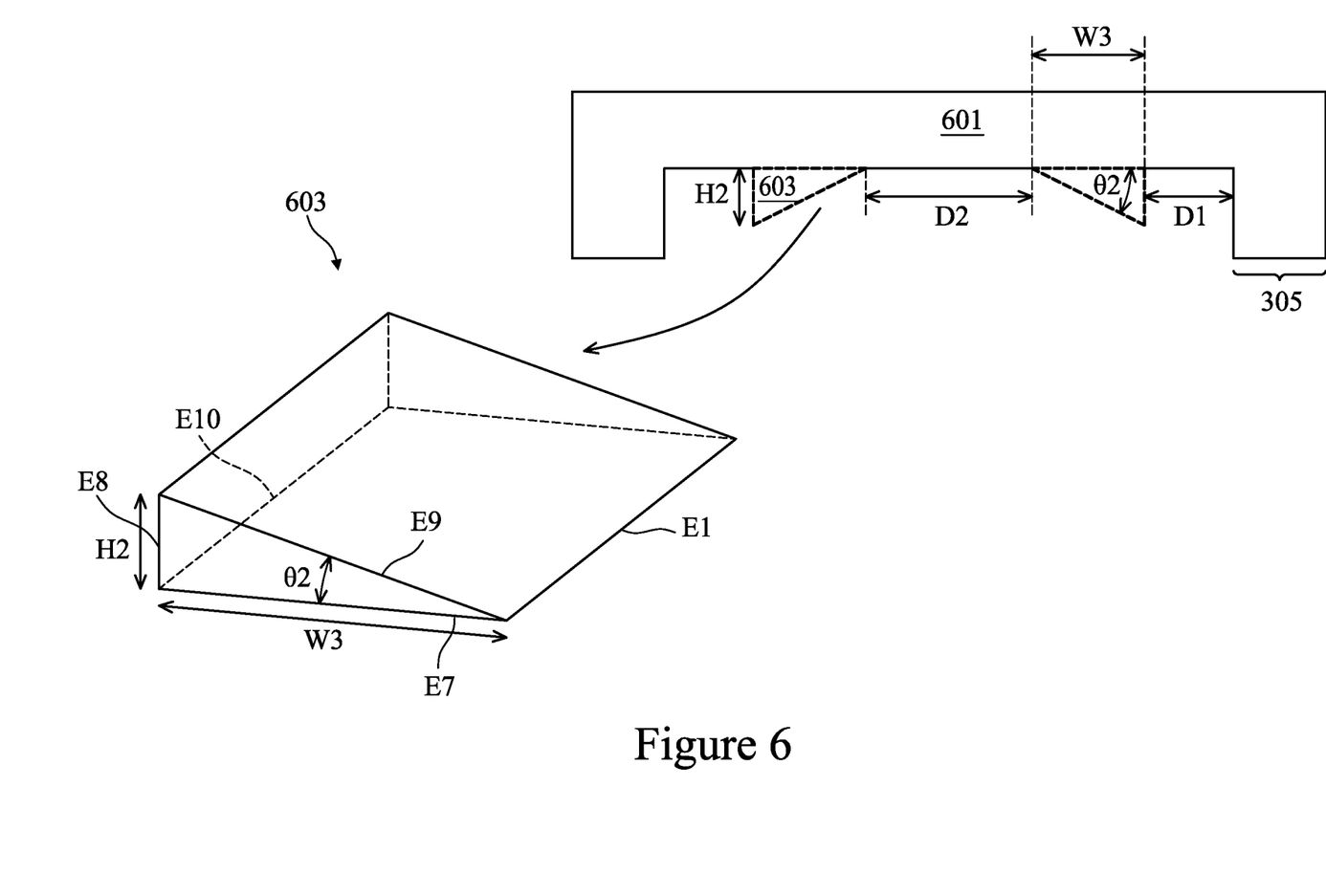
FIGS. 6 and 7 illustrate a cross-sectional view and a top down view of the thermal lid with second wedge features in the first location, respectively, in accordance with some embodiments.

With reference now to FIG. 6, this figure illustrates a cross sectional view of a second lid 601 and a magnified perspective view of a second wedge feature 603, according to some embodiments. In particular, FIG. 6 illustrates the second wedge feature 603 having the tapered front edge E1, a third width W3 along a third base edge E7, a second height H2 along a riser face at a backend face E8, a backend base edge E10, and a second angle θ2 between the third base edge E7 and a second top edge E9. According to some embodiments, the third width W3 may be a width between about 0.1 mm and about 1.0 mm. However, any suitable width may be used for the third width W3. The second height H2 may be a height between about 0.02 mm and about 0.10 mm, in accordance with some embodiments. However, any suitable height may be used. In some embodiments, the second angle θ2 may be an angle between about 5° and about 45°. However, any suitable angle may be used. Although embodiments are disclosed with reference to the first wedge features 303 and second wedge features 603, these wedge features may also be referred to herein as angled projections, angled protrusions, beveled surfaces, sloped ridges, sloped contours, or the like.

Figure 7:
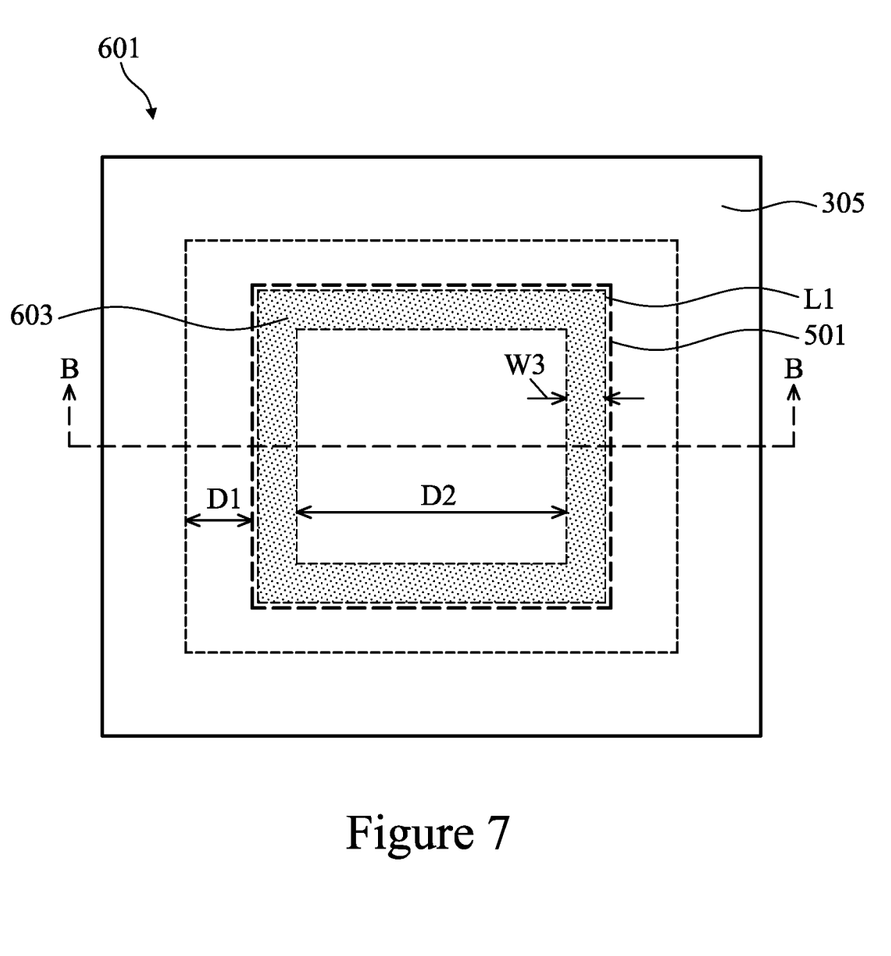

FIG. 7 illustrates a top-down view of the second lid 601 illustrated in FIG. 6, in accordance with some embodiments. In particular, FIG. 7 illustrates the second wedge feature 603, the foot region 305, and the interposer region 501 in phantom view to indicate the locations of these features, according to some embodiments, beneath the upper surface of the second lid 601. In some embodiments, the interposer region 501 is surrounded by the foot region 305 of the second lid 601. According to some embodiments, the second wedge feature 603 is in a ring configuration located at the first location L1 along a perimeter of the interposer region 501. FIG. 7 further illustrates the third width W3 of the second wedge feature 603. Still further, FIG. 7 illustrates a second cut line B-B through the second lid 601 which is referenced herein in relation to the cross sections illustrated in FIGS. 6 and 8.

Figure 8:
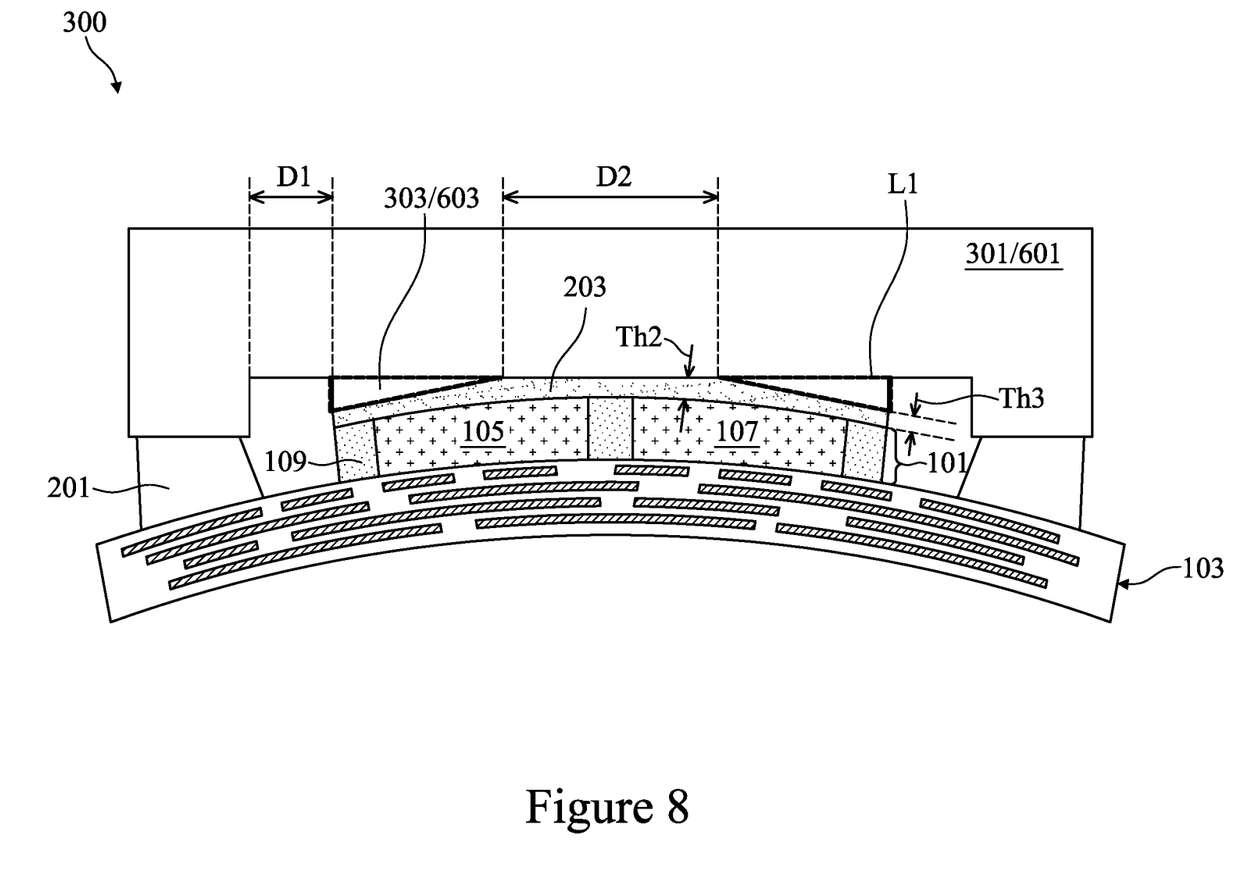
FIG. 8 illustrates a cross-sectional view of the integrated fan-out package with the lids of FIGS. 4-7 and with the integrated fan-out package being under stress due to package warpage, in accordance with some embodiments.

Continuing to FIG. 8, this figure illustrates package warpage of the first 3DIC package 300 with the first wedge features 303 of FIG. 4 (or the second wedge feature 603 of FIG. 6) being located in the first location L1, according to some embodiments. In the first location L1, a sidewall of the first wedge features 303 or the second wedge feature 603 substantially aligns with an edge of the package 101. During placement of the thermal lid, pressure may be applied to compress the TIM 203 such that the thermal interface material conforms to the bottom surfaces of the thermal lid including the wedge features. As such, maximum surface areas of the first wedge features 303 (or the second wedge feature 603) interface with the TIM 203. Furthermore, the TIM 203 may be formed to have the second thickness Th2 over the center portion of the package 101 and to have the third thickness Th3 over a perimeter and/or corner portions of the package 101. In some embodiments, the thickness is a graded thickness from the second thickness Th2 at a tapered edge of the first wedge features 303/603 to a minimum thickness at an edge of the encapsulant 109.

In particular, FIG. 8 illustrates the compliance of the TIM 203 to the package 101 and the first lid 301 after package warpage of the first 3DIC package 300. As such, the first wedge features 303 (shown in FIGS. 3-5) and the second wedge feature 603 (shown in FIGS. 6 and 7) help to prevent delamination of the TIM 203 from the first lid 301 due to package warpage. Furthermore, FIG. 8 also illustrates an interface between the TIM 203 and a central portion of the first lid 301 that has that second distance D2 extending between inner edges of the first wedge features 303, according to some embodiments.

Figure 9:
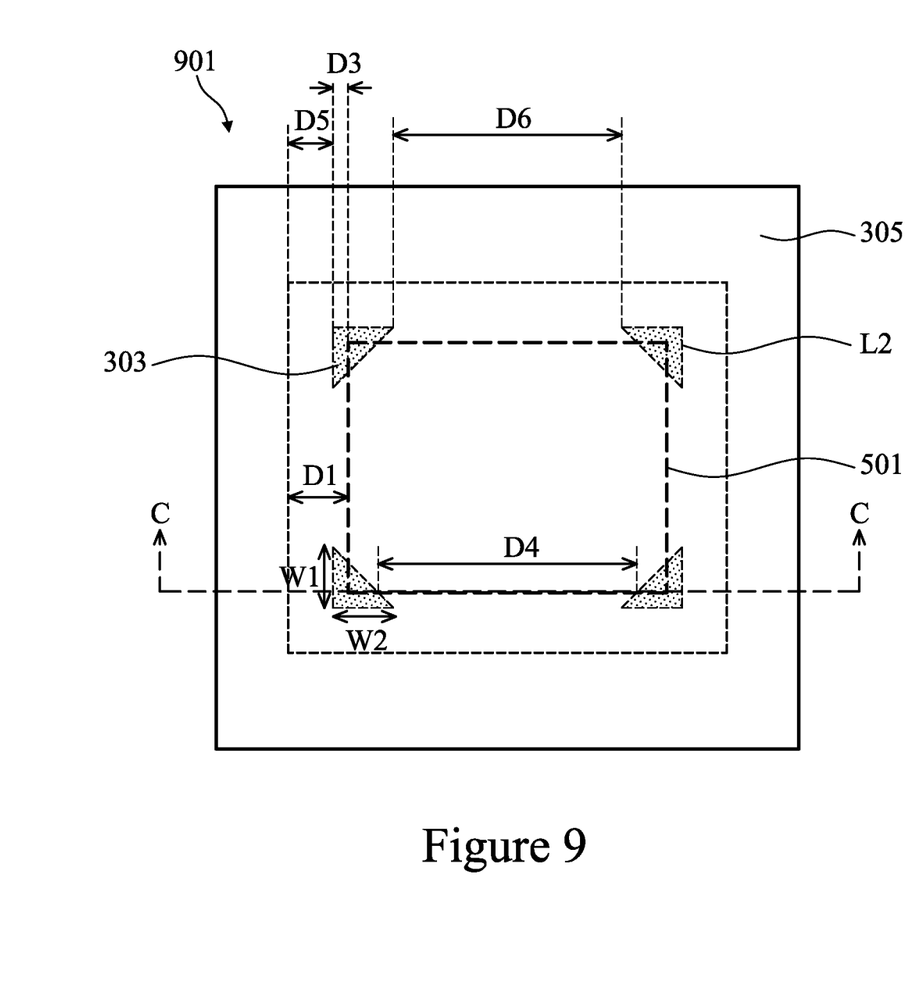
FIGS. 9 and 10 illustrate a cross-sectional view and a top down view of the thermal lid with the first wedge features and the second wedge features in a second location, respectively, in accordance with still other embodiments.

FIG. 9 illustrates a top-down view of a third lid 901, in accordance with some embodiments. In particular, FIG. 9 is similar to FIG. 5 except the first wedge features 303 are located in second locations L2 of the third lid 901. As such, the first wedge features 303 overlap the corners of the interposer region 501. FIG. 9 further illustrates the first wedge features 303, the foot region 305, and the interposer region 501 in phantom view to indicate the locations of these features, according to some embodiments, beneath the upper surface of the third lid 901. According to some embodiments, the first wedge features 303 have the first width W1 and the second width W2, although any suitable widths may be used.

FIG. 9 further illustrates that, in the second locations L2, a sidewall of the first wedge features 303 extends beyond the interposer region 501 by a third distance D3. According to some embodiments, the third distance D3 is a distance between about 0.1 mm and about 0.5 mm. However, any suitable distance may be used. With the first wedge features 303 being in the second location L2, an interface between the interposer region 501 and third lid 901 extends a fourth distance D4 along a boundary of the interposer region 501. According to some embodiments, the fourth distance D4 may be a distance between about 10 mm and about 60 mm. However, any suitable distance may be used. FIG. 9 also illustrates an edge of the third wedge features 303 being a fifth distance D5 from a sidewall of the foot region 305 of the third lid 901 and further illustrates adjacent third wedge features 303 being a sixth distance D6 apart from one another. According to some embodiments, the fifth distance D5 may be a distance between about 2 mm and about 10 mm. However, any suitable distance may be used. Still further, the sixth distance D6 may be a distance between about 10 mm and about 60 mm, in accordance with some embodiments. However, any suitable distances may be utilized for the fifth distance D5 and the sixth distance D6. Still further, FIG. 9 illustrates a third cut line C-C through the third lid 901 which is referred to below in relation to the cross section illustrated in FIG. 11.

Figure 10:
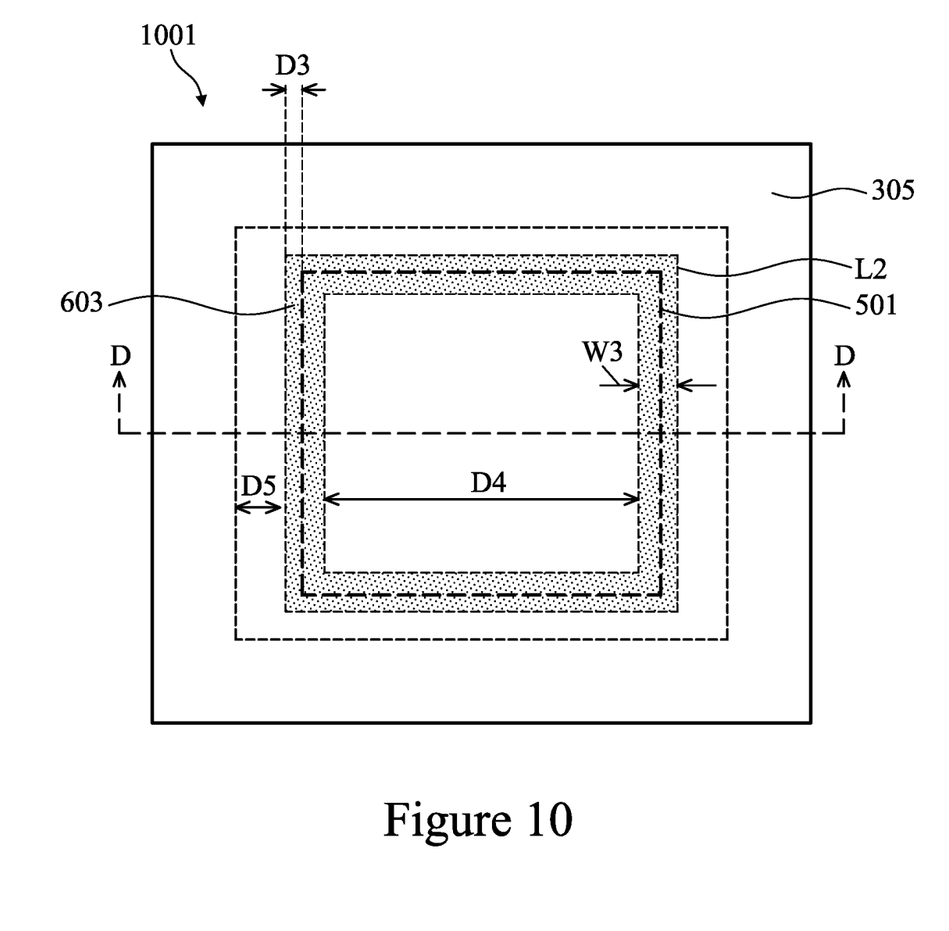

FIG. 10 illustrates a top-down view of a fourth lid 1001, in accordance with some embodiments. In particular, FIG. 10 is similar to FIG. 7 except a second wedge feature 603 is located in the second location L2 of the fourth lid 1001. As such, the second wedge feature 603 overlaps the perimeter of the interposer region 501. FIG. 10 further illustrates the second wedge feature 603, the foot region 305, and the interposer region 501 in phantom view to indicate the locations of these features, according to some embodiments, beneath the upper surface of the fourth lid 1001. In some embodiments, the interposer region 501 is surrounded by the foot region 305 of the fourth lid 1001. According to some embodiments, the second wedge feature 603 has the third width W3, although any suitable width may be used.

FIG. 10 further illustrates that, in the second locations L2, a sidewall of the second wedge feature 603 extends beyond the perimeter of the interposer region 501 by the third distance D3, such that the sidewall of the second wedge feature 603 is not aligned with either the encapsulant 109 or the TIM 203. However, any suitable distance may be used. With the second wedge feature 603 being in the second location L2, an interface between the interposer region 501 and fourth lid 1001 extends the fourth distance D4 across the interposer region 501. However, any suitable distance may be used. FIG. 10 also illustrates an edge of the second wedge feature 603 being the fifth distance D5 from a sidewall of the foot region 305 of the fourth lid 1001. However, any suitable distance may be utilized. Still further, FIG. 10 illustrates a fourth cutline D-D through the fourth lid 1001 which is referred to below in relation to the cross section illustrated in FIG. 11.

Figure 11:
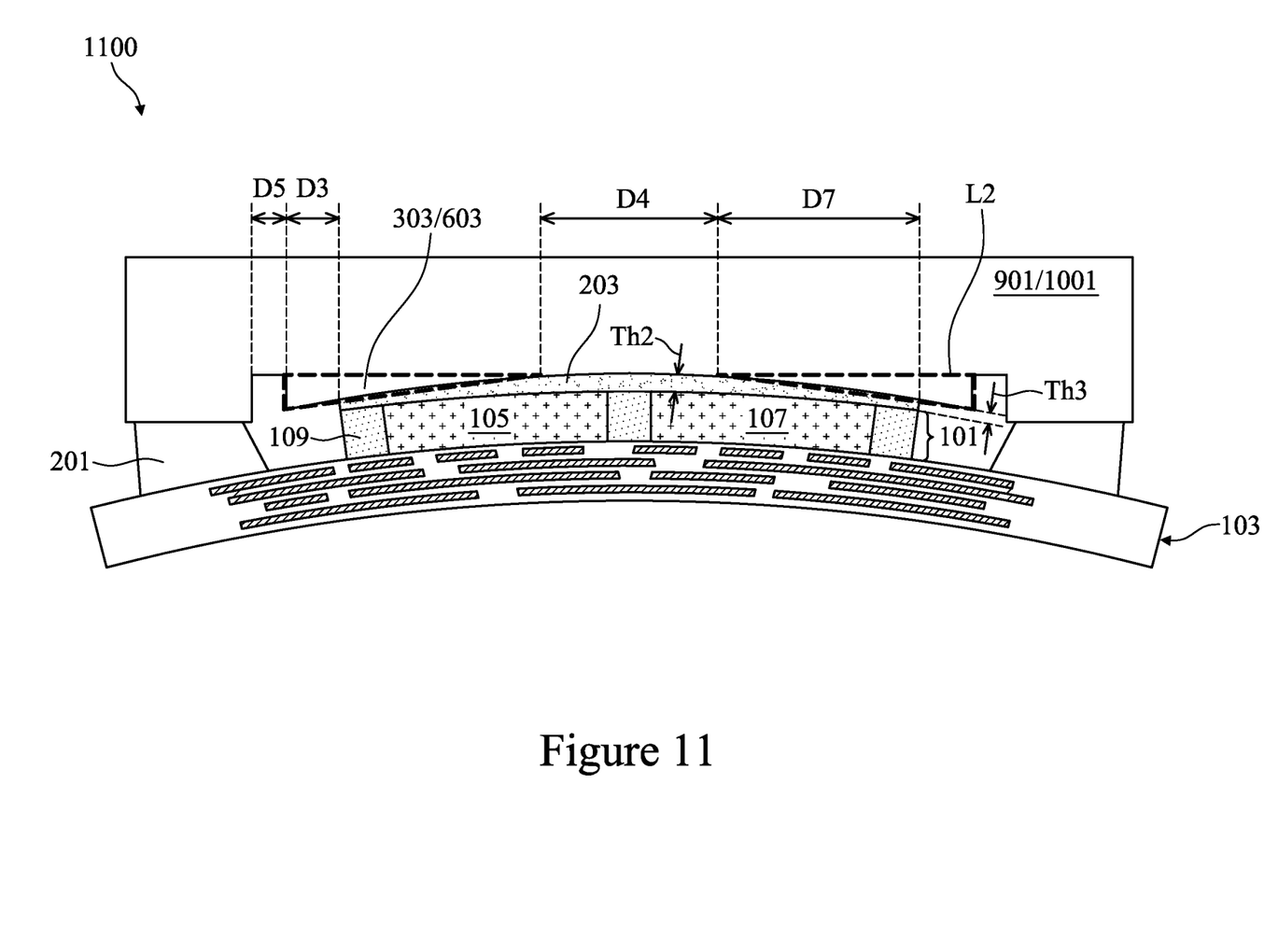
FIG. 11 illustrates a cross-sectional view of the integrated fan-out package with the lids of FIGS. 9 and 10 and with the integrated fan-out package being under stress due to package warpage, in accordance with some embodiments.

Turning now to FIG. 11, this figure illustrates package warpage of a second 3DIC package 1100 with the first wedge features 303 or the second wedge feature 603 being located in the second location L2 (either through cut line C-C in FIG. 9 or through cut line D-D in FIG. 10), according to some embodiments. During placement of the thermal lid, pressure may be applied to compress the TIM 203 such that the thermal interface material conforms to the bottom surfaces of the thermal lid including portions of the wedge features overlying the package 101. As such, the portions of the first wedge features 303 (or the second wedge feature 603) interface with the TIM 203. Furthermore, the TIM 203 may be formed to have the second thickness Th2 over the center portion of the package 101 and to have the third thickness Th3 over a perimeter and/or corner portions of the package 101. In some embodiments, the thickness is a graded thickness from the second thickness Th2 at a tapered edge of the first wedge features 303/603 to a minimum thickness at an edge of the encapsulant 109. In some embodiments, the first wedge features 303 and/or second wedge feature 603 may be beveled surfaces of the third lid 901 and/or the fourth lid 1001, the beveled surfaces having lateral extents that extend beyond a lateral extent of the encapsulant 109. However, the lateral extents of the beveled surfaces may be aligned with the lateral extent of the encapsulant 109.

In particular, FIG. 11 illustrates the compliance of the TIM 203 to the package 101 and the fourth lid 1001 after package warpage of the second 3DIC package 1100. As such, the first wedge features 303 and the second wedge feature 603 (shown in FIGS. 9 and 10, respectively) help to prevent delamination of the TIM 203 from the fourth lid 1001 due to package warpage.

With reference to the third lid 901 and the third cut-line C-C (illustrated in FIG. 9), FIG. 11 illustrates a cross-sectional view of the second 3DIC package 1100. In particular, FIG. 11 illustrates outer edges of the first wedge features 303, in the second location L2, extending beyond the sidewalls of the package 101 by the third distance D3. However, any suitable distance may be used. FIG. 11 further illustrates an interface between the TIM 203 and the third lid 901 at the boundary of the interposer region 501 (shown in FIG. 9) extends the fourth distance D4 between the adjacent first wedge features 303, according to some embodiments. However, any suitable distance may be used.

With reference to the fourth lid 1001 and the fourth cut-line D-D (illustrated in FIG. 10), FIG. 11 illustrates a cross-sectional view of the second 3DIC package 1100. In particular, FIG. 11 illustrates outer edges of the second wedge feature 603, in the second location L2, extending beyond the sidewalls of the package 101 by the third distance D3. However, any suitable distance may be used. FIG. 11 further illustrates an interface between the TIM 203 and the third lid 901 (shown in FIG. 10) extends the fourth distance D4 between inner edges of the second wedge feature 603, according to some embodiments. However, any suitable distance may be used.

Embodiments may achieve advantages. The first wedge features 303 and the second wedge feature 603 help to prevent delamination of the TIM 203 from the first lid 301 due to package warpage. The thermal properties and integrity of the interface between the TIM 203 and wedge features are maintained even under stresses imparted by package warpage. Furthermore, the wedge features allow for differences in minimum BLT of the TIM 203 to be used to accommodate for gap variations from a center of a package to the corners and/or edges of the package. As such, delamination of the TIM 203 from the thermal lid and/or delamination of the TIM 203 from the corners and/or edges of the package 101 are prevented. The methods and devices described herein allow for the production of robust packaged devices.

In accordance with an embodiment, a semiconductor device includes: a semiconductor chip package bonded to a substrate; a thermal interface material on the semiconductor chip package; and a lid over the semiconductor chip package and the substrate, the lid comprising a wedge feature interfacing the thermal interface material. In an embodiment the wedge feature comprises a tapered edge, the tapered edge interfacing the thermal interface material. In an embodiment the wedge feature comprises a first base edge and a second base edge, the first base edge and the second base edge interfacing the thermal interface material. In an embodiment the wedge feature comprises a backend edge intersecting the first base edge and the second base edge, the backend edge interfacing the thermal interface material. In an embodiment the wedge feature comprises a ring configuration, the tapered edge extending along an inner perimeter of the ring configuration. In an embodiment the wedge feature comprises a backend base edge extending along an outer perimeter of the ring configuration, the backend base edge interfacing the thermal interface material. In an embodiment the wedge feature comprises a backend base edge extending along an outer perimeter of the ring configuration, the backend base edge being located outside of a perimeter of the thermal interface material.

In accordance with another embodiment, a method includes: bonding a three-dimensional integrated circuit package to a substrate, the three-dimensional integrated circuit package comprising a semiconductor die embedded within an encapsulant; depositing a thermal interface material on the three-dimensional integrated circuit package; placing a heat spreader over the thermal interface material and compressing the thermal interface material, the thermal interface material conforming to a beveled surface of the heat spreader; and curing the thermal interface material. In an embodiment, after the placing of the heat spreader, the thermal interface material has a first thickness over the semiconductor die and a second thickness over the encapsulant, the second thickness being less than the first thickness. In an embodiment, the thickness of the thermal interface material is graded from a greatest thickness at a tapered edge of the beveled surface to a minimum thickness at an edge of the encapsulant. In an embodiment, the beveled surface has an angle of between about 5° and about 45°. In an embodiment, the beveled surface of the heat spreader has a first lateral extent being aligned to a second lateral extent of the encapsulant. In an embodiment, the beveled surface of the heat spreader has a first lateral extent that extends outside of a second lateral extent of the encapsulant.

In accordance with yet another embodiment, a semiconductor device includes: a device die bonded to a substrate, the device die being surrounded by an encapsulant; a thermal interface material disposed on a surface of the device die opposite the substrate, the thermal interface material in physical contact with both the device die and the encapsulant; and a thermal lid comprising an angled projection, the thermal interface material extending between the thermal lid and the device die, the thermal interface material also extending between the angled projection and the encapsulant. In an embodiment, the thermal interface material has a first thickness between the device die and the thermal lid and a second thickness between the encapsulant and the angled projection, the second thickness being less than the first thickness. In an embodiment, a thickness of the thermal interface material is graded from a maximum thickness at a tapered edge of the angled projection to a minimum thickness at an edge of the encapsulant. In an embodiment, the angled projection comprises a backend edge aligned to a corner of the encapsulant. In an embodiment, the angled projection comprises a backend edge that extends beyond an outer edge of the encapsulant. In an embodiment, the angled projection has a ring configuration and a backend edge of the ring configuration is aligned to an edge of the encapsulant. In an embodiment, the angled projection has a ring configuration and a backend edge of the ring configuration extends past the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
 a semiconductor chip package bonded to a substrate and surrounded by an encapsulant;
 a thermal interface material on the semiconductor chip package; and
 a lid over the semiconductor chip package, the encapsulant, and the substrate, the lid comprising a wedge feature interfacing the thermal interface material, wherein the wedge feature comprises a tapered edge, the tapered edge interfacing the thermal interface material.

2. The semiconductor device of claim 1, wherein the wedge feature comprises a first base edge and a second base edge, the first base edge and the second base edge interfacing the thermal interface material.

3. The semiconductor device of claim 2, wherein the wedge feature comprises a backend edge intersecting the first base edge and the second base edge, the backend edge interfacing the thermal interface material.

4. The semiconductor device of claim 1, wherein the wedge feature comprises a ring configuration, the tapered edge extending along an inner perimeter of the ring configuration.

5. The semiconductor device of claim 4, wherein the wedge feature comprises a backend base edge extending along an outer perimeter of the ring configuration, the backend base edge interfacing the thermal interface material.

6. The semiconductor device of claim 4, wherein the wedge feature comprises a backend base edge extending along an outer perimeter of the ring configuration, the backend base edge being located outside of a perimeter of the thermal interface material.

7. A semiconductor device comprising:
   a device die bonded to a substrate, the device die being surrounded by an encapsulant;
   a thermal interface material disposed on a surface of the device die opposite the substrate, the thermal interface material in physical contact with both the device die and the encapsulant; and
   a thermal lid comprising an angled projection, the thermal interface material extending between the thermal lid and the device die, the thermal interface material also extending between the angled projection and the encapsulant.

8. The semiconductor device of claim 7, wherein the thermal interface material has a first thickness between the device die and the thermal lid and a second thickness between the encapsulant and the angled projection, the second thickness being less than the first thickness.

9. The semiconductor device of claim 7, wherein a thickness of the thermal interface material is graded from a maximum thickness at a tapered edge of the angled projection to a minimum thickness at an edge of the encapsulant.

10. The semiconductor device of claim 7, wherein the angled projection comprises a backend edge aligned to a corner of the encapsulant.

11. The semiconductor device of claim 7, wherein the angled projection comprises a backend edge that extends beyond an outer edge of the encapsulant.

12. The semiconductor device of claim 8, wherein the angled projection has a ring configuration and a backend edge of the ring configuration is aligned to an edge of the encapsulant.

13. The semiconductor device of claim 8, wherein the angled projection has a ring configuration and a backend edge of the ring configuration extends past the encapsulant.

14. A semiconductor device comprising:
   a three-dimensional integrated circuit package bonded to a substrate, the three-dimensional integrated circuit package comprising a semiconductor die embedded within an encapsulant;
   a thermal interface material on the three-dimensional integrated circuit package; and
   a heat spreader over the thermal interface material, the thermal interface material conforming to a beveled surface of the heat spreader, wherein the thermal interface material has a first thickness over the semiconductor die and a second thickness over the encapsulant, the second thickness being less than the first thickness.

15. The semiconductor device of claim 14, wherein the thickness of the thermal interface material is graded from a greatest thickness at a tapered edge of the beveled surface to a minimum thickness at an edge of the encapsulant.

16. The semiconductor device of claim 15, wherein the beveled surface has an angle of between about 5° and about 45°.

17. The semiconductor device of claim 14, wherein the beveled surface of the heat spreader has a first lateral extent being aligned to a second lateral extent of the encapsulant.

18. The semiconductor device of claim 14, wherein the beveled surface of the heat spreader has a first lateral extent that extends outside of a second lateral extent of the encapsulant.

19. The semiconductor device of claim 1, wherein the thermal interface material has a thermal conductivity between about 3 W/m·K to about 5 W/m·K.

20. The semiconductor device of claim 14, wherein the thermal interface material has a thermal conductivity between about 10 W/m·K to about 50 W/m·K.

* * * * *